US009197534B2

(12) United States Patent
Miyao

(10) Patent No.: US 9,197,534 B2
(45) Date of Patent: Nov. 24, 2015

(54) NETWORK DESIGNING SYSTEM, NETWORK DESIGNING METHOD, DATA TRANSFER PATH DETERMINATION METHOD AND NETWORK DESIGNING PROGRAM

(75) Inventor: Yasuhiro Miyao, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 13/392,077

(22) PCT Filed: Aug. 19, 2010

(86) PCT No.: PCT/JP2010/063989
§ 371 (c)(1),
(2), (4) Date: Feb. 23, 2012

(87) PCT Pub. No.: WO2011/024701
PCT Pub. Date: Mar. 3, 2011

(65) Prior Publication Data
US 2012/0158924 A1 Jun. 21, 2012

(30) Foreign Application Priority Data
Aug. 26, 2009 (JP) ................. 2009-195499

(51) Int. Cl.
G06F 15/173 (2006.01)
H04L 12/56 (2006.01)
H04L 12/28 (2006.01)
H04L 12/701 (2013.01)
(Continued)

(52) U.S. Cl.
CPC ............... *H04L 45/00* (2013.01); *H01L 45/04* (2013.01); *H04L 45/48* (2013.01)

(58) Field of Classification Search
USPC ............................................ 706/55; 709/238
See application file for complete search history.

(56) References Cited

U.S. PATENT DOCUMENTS 7,693,071 B2  4/2010 Achlioptas et al.
7,760,668 B1* 7/2010 Zinjuvadia ............... 370/256
(Continued)

FOREIGN PATENT DOCUMENTS

JP  2005-33715 A  2/2005
JP  2008-546276 A  12/2008
(Continued)

OTHER PUBLICATIONS

Jon Baggaley, Batchuluun Batpurev, and Jim Klaas, "The World-Wide Inaccessible Web, Part 2: Internet Routes", The International Review of Research in Open and Distance Learning vol. 8, No. 2 (2007),(http://irrodl.org/index.php/irrodl/article/view/447/932).
(Continued)

*Primary Examiner* — Emmanuel L Moise
*Assistant Examiner* — Mahran Abu Roumi
(74) *Attorney, Agent, or Firm* — McGinn IP Law Group, PLLC

(57) ABSTRACT

Data transfer with high throughput is enabled between servers. With respect to a candidate of a network operation unit applied at least one to each site of a plurality of sites forming a network, a combination of the network operation units each one of which is to be used by each site is determined such that all the sites become reachable based on a connection relationship applied to each pair of the candidates of the network operation units between different sites.

27 Claims, 12 Drawing Sheets

(51) Int. Cl.
*H01L 45/00* (2006.01)
*H04L 12/753* (2013.01)

(56) References Cited

U.S. PATENT DOCUMENTS

| | | | |
|---|---|---|---|
| 8,520,556 B2 | 8/2013 | Karuppiah et al. | |
| 2004/0034702 A1* | 2/2004 | He | 709/224 |
| 2005/0083964 A1* | 4/2005 | Tatman et al. | 370/461 |
| 2006/0067337 A1* | 3/2006 | Netravali et al. | 370/400 |
| 2006/0092862 A1* | 5/2006 | Benedetto et al. | 370/256 |
| 2006/0156280 A1* | 7/2006 | Chen et al. | 717/105 |
| 2007/0248049 A1* | 10/2007 | Fajardo et al. | 370/331 |
| 2008/0178293 A1* | 7/2008 | Keen et al. | 726/23 |
| 2008/0228940 A1* | 9/2008 | Thubert | 709/238 |
| 2010/0262576 A1* | 10/2010 | Stockwell et al. | 706/55 |
| 2011/0022582 A1* | 1/2011 | Unnikrishnan et al. | 707/715 |
| 2012/0158924 A1* | 6/2012 | Miyao | 709/220 |

FOREIGN PATENT DOCUMENTS

| | | | |
|---|---|---|---|
| WO | WO 2008/128564 A1 | 10/2008 | |
| WO | WO 2009/098748 A1 | 8/2009 | |

OTHER PUBLICATIONS

J. Padhye, V. Firoiu, D. Towsley, J. Kurose, "Modeling TCP Throughput: A Simple Model and Its Empirical Validation", Proceedings of SIGCOMM 98, 1998(http://conferences.sigcomm.org/sigcomm/1998/tp/paper25.pdf).
Configuring Hierarchical Squid Caches (http://old.squid-cache.org/Doc/HierarchyTutorial/tutorial-7.html).
Hayim Porat, Nurit Sprecher, and Zehavit Alon, "E-NNI Registration Protocol", (http://www.ieee802.org/1/files/public/docs2009/new-porat-E-NNI-Registration-protocol-0309-v03.pdf.), Mar. 2009.
Japanese Office Action dated May 13, 2014, with partial English translation.
International Search Report in PCT/JP2010/063991 dated Sep. 14, 2010 (English Translation Thereof).
Y. Rekhter and T. Li, "A Border Gateway Protocol 4 (BGP-4)", RFC1771, Mar. 1995;(http://faqs.org/rfcs/rfc1771.html).
Jon Baggaley, Batchuluun Batpurev, and Jim Klaas, "The World-Wide Inaccessible Web, Part 2: Internet Routes", The International Review of Research in Open and Distance Learning vol. 8, No. 2 (2007),(http://irrodl.org/index.php./irrodl/article/view/447/932).
J. Padhye, V. Firoiu, D. Towsley, J. Kurose, "Modeling TCP Throughput: A Simple Model and Its Empirical Validation", Proceedings of SIGCOMM 98, 1998(http://conferences.sigcomm.org/sigcomm/1998/tp/paper25.pdf.
Robert Endre Tarjan, Data Structures and Network Algorithms, Society for Industrial Mathematics, Jan. 1, 1987;.
Configuring Hierarchical Squid Caches (http://old.squid-cache.org/Doc/Hierarchy-Tutorial/tutorial-7.html).
Hayim Porat, Nurit Sprecher, and Zehavit Alon, "E-NNI Registration Protocol", (http://www.ieee802.org/1/files/public/docs2009/new-porat-E-NNI-Registration-protocol0309-v03.pdf.).
Motohisa Konno, "Traffic o Jyunan ni Sossa suru BGP no Keiro Sentaku o Master", Nikkei Network, No. 87, Jun. 22, 2007, pp. 174 to 178.
Masaaki Yoneda, "Kawaru Internet no Kozo Provider Kan Setsuzoku ni Shin Rule", Nikkei Communication, No. 260, Dec. 15, 1997, pp. 146 to 155.
Kazuhiko Yamamoto et al., "Nippon Internet no AS eno Bunkatsu ni Tsuite", Information Processing Society of Japan Kenkyu Hokoku, 93-DPS-59-5, Jan. 29, 1993.

\* cited by examiner

| AS set | Max link length | # of links |
|---|---|---|
| ( 0,0,0,0 ) | 5768 | |
| ( 1,0,0,0 ) | 3212 | 5 |
| ( 1,1,0,0 ) | 4330 | |
| ( 1,1,1,0 ) | 5768 | |
| ( 0,0,0,1 ) | 5768 | |
| ( 1,0,0,1 ) | 3212 | 6 |
| ( 1,1,0,1 ) | 4330 | |
| ( 1,0,1,1 ) | 5768 | |
| ( 1,1,1,1 ) | 5768 | |

(TYO, HCM, JKT, MNL)
 TYO: AS2516=0, AS2914=1
 HCM: AS7643=0, AS18403=1
 JKT: AS4761=0, AS7713=1
 MNK: AS4775=0, AS6648=1

ADJACENT RELATIONSHIP
BETWEEN ASS (AS LINK)

NETWORK DESIGNING SYSTEM, NETWORK DESIGNING METHOD, DATA TRANSFER PATH DETERMINATION METHOD AND NETWORK DESIGNING PROGRAM

TECHNICAL FIELD

The present invention relates to a network designing system, a network designing method, a data transfer path determination method and a network designing program and, more particularly, a network designing system, a network designing method, a data transfer path determination method and a network designing program of a network which accommodates a plurality of server sites or data centers.

BACKGROUND ART

In the Internet, data transfer is executed between sites located in a geographically distributed manner, and a volume of data transmitted and received between sites has been increased in recent years. It is therefore demanded to transfer data at a high speed even its volume of data transfer is large.

Site here is assumed to represent a place where one or a plurality of server machines are disposed which are capable of processing or accumulating data as shown in FIG. 11, for example.

With reference to FIG. 11, server machines 1030a to 1030n of a site 1000 are connected to an edge router 1010 located for accessing an AS (Autonomous System) 1200 provided by an ISP (Internet Service Provider) through an L2 switch 1020. The L2 switch 1020 is not limited to that shown but can be a multilayer switch, for example.

The edge router 1010 is connected to the AS 1200, and the site 1000 uses the AS 1200 to link to the entire Internet 1100 through one AS 1200.

At least one of server machines 1030a to 1030n is provided and the number of the same is assumed not to be limited.

Specific method of identifying such a site disposed in a geographically distributed manner as described above is an identification method on a city or nation basis, for example.

Site installation form ranges from small-size installation in which a server machine stored in a rack is disposed on a floor in a building to an Internet data center (iDC) which exclusively accommodates groups of a large number of server machines.

Specific example of high-speed data transfer between respective sites disposed in a geographically distributed manner includes copying of data from a Web site issued from a contents holder or a site which hosts contents data such as moving image (also called as an origin site) to an edge site which executes delivery to an end user in a CDN (Contents Delivery Network).

Another example in a CDN is, when an edge site accessed by a contents user fails to cache contents which are desired by the contents user and whose time limit is yet to come, to transfer contents data from the above-described origin site to the edge site.

A further example is to transfer data which is dynamically generated by an origin site and which cannot be originally cached from the origin site to an edge site accessed by an end user.

In these examples, transferring data from an origin site to an edge site at a high-speed enhances bodily sensation and satisfaction of an end user.

In the Internet, when transferring data between sites disposed in a geographically distributed manner, it is crucial to select an optimum transfer path in order to execute high-speed data transfer.

In the past related art, a functionally optimum path cannot be always selected.

In the following, description will be made in order with respect to data transfer according to related art between sites disposed in a geographically distributed manner.

First, the Internet is structured with ASs each as a unit of a network operated by an ISP, a major portal provider or the like connected with each other.

AS is a set of individual routers and end systems and has a unique number in the world allotted.

Each AS exchanges path information based on a row of AS numbers reachable to a certain IP (Internet Protocol) address prefix by using a path control protocol called BGP (Border Gateway Protocol). IP address prefix represents a set of IP addresses whose numbers are sequential.

Each AS generates a transfer table indicative of a hop (which is represented by an IP address applied to a network interface of a router or a server) to be transferred next to a certain IP address prefix based on received path information.

Connection between ASs is contracted and executed according to business decision of an individual operator, and a format of connection between ASs mainly includes peering and transit.

Peering is connecting ASs and exchanging traffic with each other by ISPs under equal conditions. Peering enables transmission and reception basically free of charge premised on exchange of the same volume of traffic with each other.

Also in peering, each notifies the other of a group of addresses reachable to its own subordinates.

On the other hand, transit represents packet relay service provided by a certain ISP to other company in the same industry or the like. In transit, an ISP which provides packet relay service guarantees, to a customer (other company in the same industry etc.) which receives supply of the packet relay service, reachability of a packet to the entire Internet and is paid a fee from the customer according to a volume of traffic transferred between the two parties.

At present, accumulated connection relationships between ASs by the above-described peering, transit or the like establish a layered structure between operators such as Tier1 and Tier 2 in the Internet.

Connection relationship between ASs established by peering, transit or the like gives heavy constraints on how a route between two points in the Internet is made.

In a case, for example, where a packet received by a certain AS from an AS of a peering partner is transferred to a higher AS as a provider of a transit or a packet received from a higher AS is transferred to an AS of a peering partner or data received from a peering partner is sent to another peering partner, it will be considered that a packet is in practice transferred free of charge.

In order to solve the problem, a management entity of AS usually exchanges path information by BGP according to a policy shown below. More specifically, the management entity of the AS notifies, to a peering partner or a provider of a transit, a path that can reach inside its own AS or in a case where itself is a transit provider, notifies only a path of its customer.

As a result, a path between two points by BGP is not always a functionally optimized path. More specifically, the number of hops of a router on a path between certain two points is not always the smallest.

For example, FIG. 12 shows a condition for transferring data from a site X using an AS1 to a site Y using an AS3. Specific example where a certain site uses a certain AS is that the site subscribes to an ISP which operates the AS.

Although a path having the smallest number of hops between the site X and the site Y is AS1→AS4→AS2→AS5→AS3, when each AS exchanges path information according to the above-described policy of exchanging path information, a selected path will be AS1→AS4→AS6→AS8→AS9→AS7→AS5→AS3 whose path length will be longer than the shortest path.

Actual example where a path length will be longer than the shortest path is shown in FIG. 3 of Non-Patent Literature 2, for example.

Shown in FIG. 3 of Non-Patent Literature 2 is a state where even between relatively close points in terms of geography, in such an area as Southeast Asia where connection between ASs by Internet Exchange or the like is not fully provided, packets are transferred via each of European and American Continents. Passing through different continents involves a large propagation delay.

While the foregoing is the description of data transfer according to related art between sites disposed in a geographically distributed manner, transferring data without error is an important factor in data transfer.

Therefore, used in the Internet is a TCP (Transmission Control Protocol) for transferring data of an application such as an HTTP (Hyper Text Transfer Protocol) between end systems such as a server machine or a PC of an end user without error.

In TCP, data is transferred without error by receiving and processing a response of reception confirmation of data transferred.

Throughput at the time of data transfer by TCP depends on RTT (Round Trip Time) equivalent to a delay caused in a to-and-fro of transmission and reception or on a packet loss rate. One example is shown in Non-Patent Literature 3.

RTT includes a to-and-fro propagation delay in transmission and reception, a protocol processing delay of a packet in a device at the time of to-and-fro, a delay in transfer onto a line and the like. In a to-and-fro of transmission and reception, the same path is not always used in a to-and-fro of transmission and reception.

In general, when the number of hops on the Internet is increased in transmission and reception, a packet loss rate is increased. When a link between ASs by a submarine cable connecting different continents or islands is included, RTT will be increased by a propagation delay.

An increase in a packet loss rate or an increase in RTT will decrease throughput at the time of data transfer by TCP.

Reference literatures for the above description are:

Non-Patent Literature 1: Y. Rekhter and T. Li, "A Border Gateway Protocol 4 (BGP-4)", RFC1771, March 1995;

Non-Patent Literature 2: Jon Baggaley, Batchuluun Batpurev, and Jim Klaas, "The World-Wide Inaccessible Web, Part 2: Internet Routes", The International Review of Research in Open and Distance Learning Vol. 8, No. 2 (2007);

Non-Patent Literature 3: J. Padhye, V. Firoiu, D. Towsley, J. Kurose, "Modeling TCP Throughput: A Simple Model and Its Empirical Validation", Proceedings of SIGCOMM 98, 1998;

Non-Patent Literature 4: Robert Endre Tarjan, Data Structures and Network Algorithms, Society for Industrial Mathematics, Jan. 1, 1987;

Non-Patent Literature 5: Configuring Hierarchical Squid Caches (http://old.squid-cache.org/Doc/Hierarchy-Tutorial/tutorial-7.html); and Non-Patent Literature 6: Hayim Porat, Nurit Sprecher, and Zehavit Alon, "E-NNI Registration Protocol", http://www.ieee802.org/1/files/public/docs2009/new-porat-E-NNI-Registration-protocol-0309-v03.pdf.

In the above-described data transfer between sites disposed in a geographically distributed manner according to the related art, when an AS to be used by each site is determined independently without specifically considering existence/non-existence of a connection relationship between ASs, throughput in data transfer might not be improved.

The reason is that when transferring data from a certain site to another site, if there exists no connection relationship between ASs used by the respective sites, more ASs will be involved in a path between the sites to increase the number of hops on a router basis, resulting in inviting an increase in RTT and packet loss opportunities to worsen throughput of TCP in some cases.

OBJECT OF THE INVENTION

An object of the present invention is to provide a network designing system, a network designing method, a data transfer path determination method and a network designing program which enable designing of a network that allows data transfer with high throughput between servers.

SUMMARY

According to a first exemplary aspect of the invention, a network designing method, includes determining, with respect to a candidate of a network operation unit applied at least one to each site of a plurality of sites forming a network, a combination of the network operation units each one of which is to be used by each site such that all the sites become reachable based on a connection relationship applied to each pair of the candidates of the network operation units between different sites.

According to a second exemplary aspect of the invention, a data transfer path determination method, includes determining a path for transferring data from a certain transmission site to another reception site based on a connection relationship given in advance to each pair of the network operation units which is obtained by the network designing method according to the invention.

According to a third exemplary aspect of the invention, a network designing system, includes a processing unit which determines, with respect to a candidate of a network operation unit applied at least one to each site of a plurality of sites forming a network, a combination of the network operation units each one of which is to be used by each site such that all the sites become reachable based on a connection relationship applied to each pair of the candidates of the network operation units between different sites.

According to a fourth exemplary aspect of the invention, a network designing program which causes a computer to execute determination processing of determining, with respect to a candidate of a network operation unit applied at least one to each site of a plurality of sites forming a network, a combination of the network operation units each one of which is to be used by each site such that all the sites become reachable based on a connection relationship applied to each pair of the candidates of the network operation units between different sites.

The present invention enables a combination to be determined on a basis of optimum network operation which allows data transfer with high throughput, thereby enabling a network to be designed which allows data transfer with higher throughput between servers.

EXEMPLARY EMBODIMENT

Next, exemplary embodiments of the present invention will be described in detail with reference to the drawings.

First Exemplary Embodiment

Figure 1:
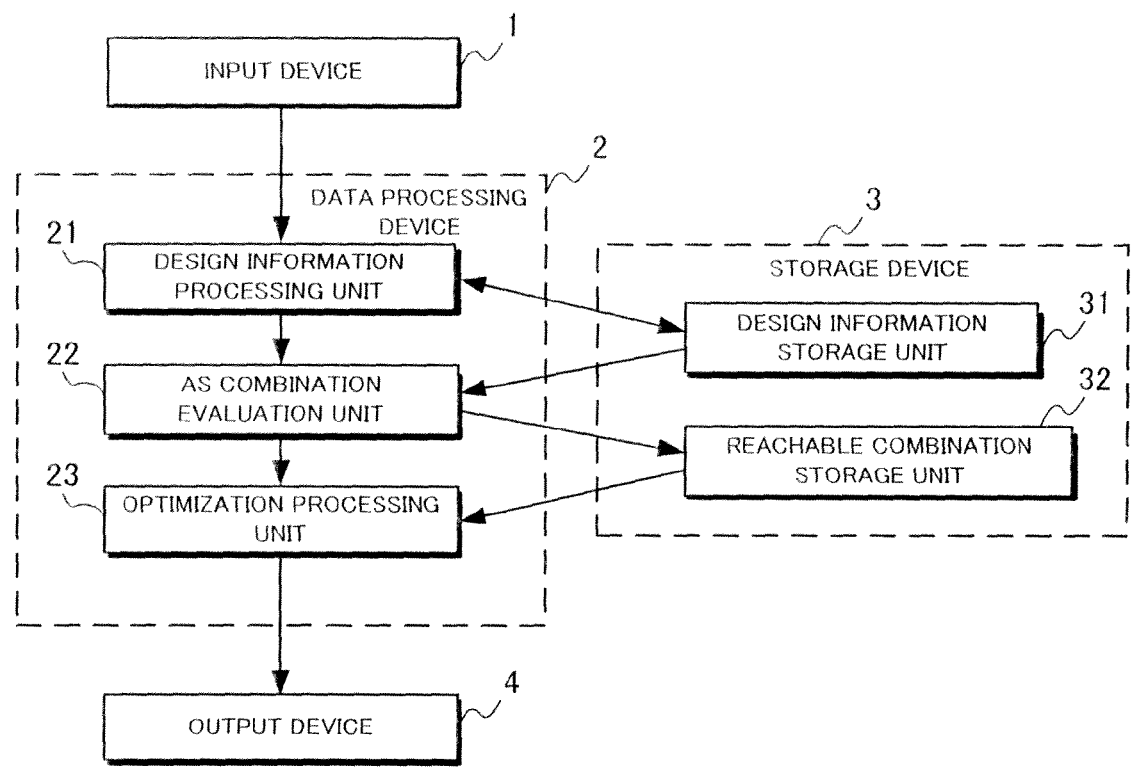
FIG. 1 is a block diagram showing a structure of a network designing system according to a first exemplary embodiment of the present invention.

FIG. 1 is a diagram showing a structure of a network designing system according to a first exemplary embodiment of the present invention.

With reference to FIG. 1, a network designing system 100 according to the first exemplary embodiment of the present invention includes an input device 1 such as a keyboard, a data processing device 2 operable under program control, a storage device 3 which stores information and an output device 4 such as a display device or a printing device.

The data processing device 2 comprises a design information processing unit 21, an AS combination evaluation unit 22 and an optimization processing unit 23.

The design information processing unit 21 creates an input format to be displayed on the output device 4 for a designer to input design information.

The design information processing unit 21 executes processing of converting design information input by a designer through the input device 1 according to the input format into a form suitable to be handled at each unit of the data processing device 2 and storing the obtained information in a design information storage unit 31.

Design information here includes information related to a method of calculating one or a plurality of objective functions, a site, an AS candidate applied to each site, existence/non-existence of a connection relationship between paired AS candidates of different sites, and when the connection relationship exists, cost applied to the connection relationship in question.

The design information processing unit 21 starts the AS combination evaluation unit 22 after storing design information converted into a form suitable for handling in the design information storage unit 31.

The AS combination evaluation unit 22 refers to design information stored in the design information storage unit 31 to create, one by one, a combination of AS candidates each to be used by each site, as well as creating a minimum spanning tree corresponding to the combination by the Prim's algorithm based on cost applied between ASs connected with each other.

Cost applied between ASs here represents a distance between ASs connected with each other.

Minimum spanning tree represents a spanning tree in which "a total sum of weights of sides" forming a graph is the smallest and a graph represents a graph formed of a set of nodes and a set of edges (links).

Since the above-described minimum spanning tree, a spanning tree, a graph and the Prim's algorithm are well-known to those skilled in the art of the present invention and the method itself is not directly relevant to the present invention, no detailed description will be made thereof.

Connection between ASs will be referred to as an AS link and a graph represented by an AS link will be referred to as an AS graph.

The AS combination evaluation unit 22 determines from a created minimum spanning tree whether all the links between sites are reachable or not. Links between all the sites being reachable denotes whether a created minimum spanning tree includes all the sites included in design information.

More specifically, the AS combination evaluation unit 22 refers to design information stored in the design information storage unit 31 to determine whether the created minimum spanning tree includes all the sites included in the design information.

With respect to an AS candidate combination in which links between all sites are determined to be reachable, the AS combination evaluation unit 22 stores information related to at least the combination of AS candidates in question in a reachable combination storage unit 32.

More specifically, information related to an AS candidate combination represents information of an AS link forming a minimum spanning tree corresponding to a combination of AS candidates in which links between all the sites are determined to be reachable.

When the AS combination evaluation unit 22 completes the processing, if at least one AS candidate combination is stored in the reachable combination storage unit 32, the optimization processing unit 23 takes out information related to the AS candidate combination in question from the reachable combination storage unit 32. Then, as to combinations of all the AS candidates stored in the reachable combination storage unit 32, the optimization processing unit 23 evaluates an objective function to calculate an optimum AS combination of the AS candidates in question. Objective function represents a value or a function value which should be minimized or maximized in an optimization problem.

More specifically, the optimization processing unit 23 evaluates a maximum value of cost of an AS link forming a minimum spanning tree corresponding to a combination of AS candidates as an objective function to calculate an optimum AS combination in which a maximum value of cost of the AS link in question will be the smallest.

The optimization processing unit 23 evaluates a total number of AS links forming the minimum spanning tree as an objective function to calculate an optimum AS combination in which the total number of AS links in question is the largest.

The optimization processing unit 23 also evaluates a total sum of costs of AS links forming the minimum spanning tree as an objective function to calculate an optimum AS combination in which the total sum of costs of the AS links in question is the smallest.

The optimization processing unit 23 also outputs the calculated optimum AS combination to the output device 4.

The storage device 3 comprises the design information storage unit 31 and the reachable combination storage unit 32.

Stored in the design information storage unit 31 is design information including information related to a method of calculating one or a plurality of objective functions, a site name, an AS candidate applied to each site, existence/non-existence of a connection relationship between paired AS candidates, and when the connection relationship exists, cost applied to the connection relationship in question.

The reachable combination storage unit 32 stores an AS combination in which links between all sites are reachable and information related to the AS combination in question which are obtained by the AS combination evaluation unit 22.

Description of Operation of the First Exemplary Embodiment

Figure 2:
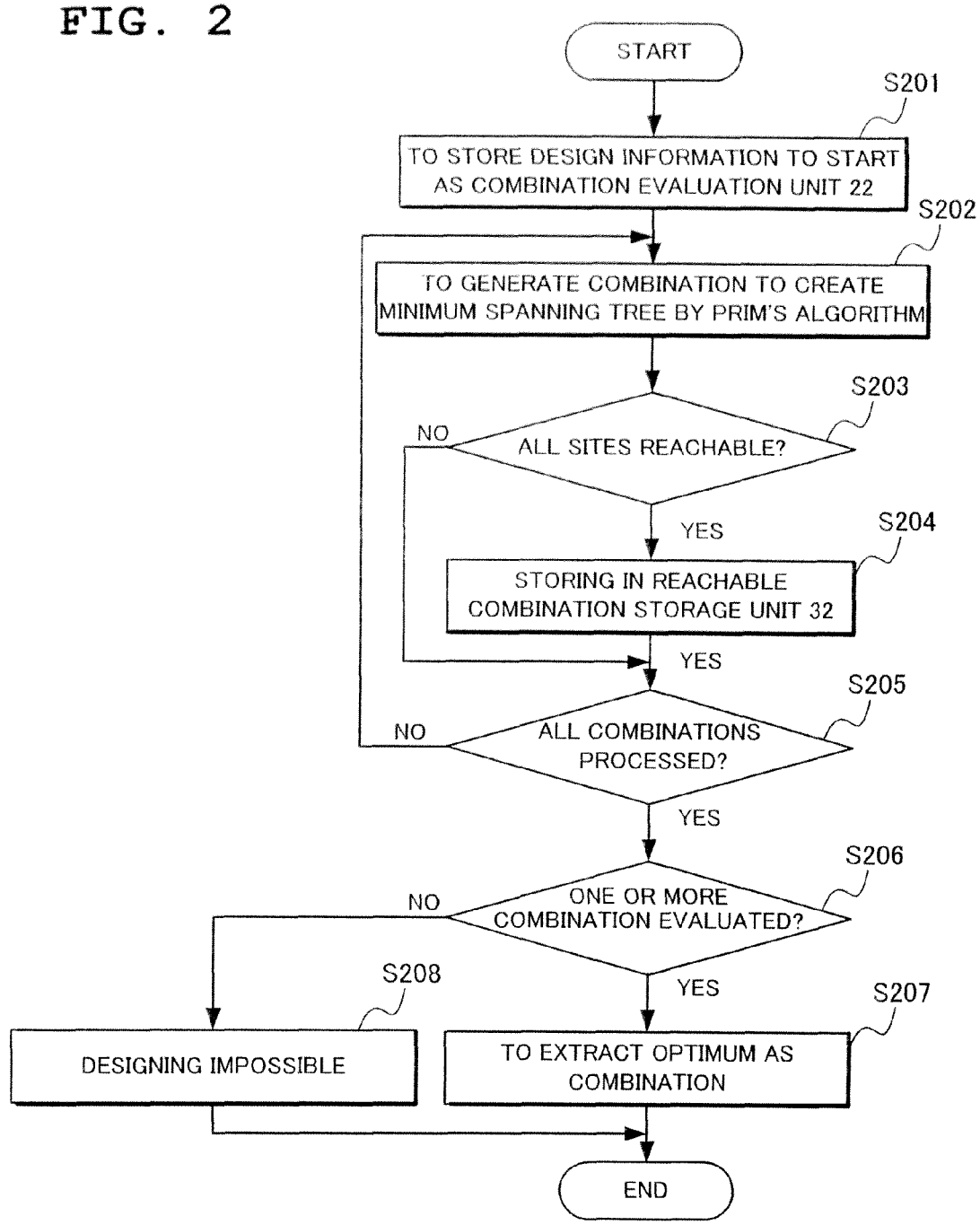
FIG. 2 is a flow chart showing operation of the network designing system according to the first exemplary embodiment of the present invention.

Next, with reference to FIG. 1 and FIG. 2, detailed description will be made of operation of the present exemplary embodiment. FIG. 2 is a flow chart showing operation of the network designing system 100 according to the present exemplary embodiment.

First, the design information processing unit 21 displays an input format on a screen by the output device 4 and a designer inputs design information by using the input device 1 according to the input format. After inputting the design information, the design information processing unit 21 converts the design information into a storage format and stores the obtained information in the design information storage unit 31 to start the AS combination evaluation unit 22 (Step S201).

Next, the AS combination evaluation unit 22 refers to the design information stored in the design information storage unit 31 to generate one combination of AS candidates each to be used by each site, as well as creating a minimum spanning tree corresponding to the AS candidate combination based on a cost applied between ASs connected with each other by the Prim's algorithm (Step S202). Minimum spanning tree will be described in the description of evaluation of an objective function.

Next, in order to check whether all the sites are reachable or not, the AS combination evaluation unit 22 refers to the design information stored in the design information storage unit 31 to check whether the minimum spanning tree obtained at Step S202 includes all the sites included in the design information (Step S203). When the minimum spanning tree includes all the sites included in the design information, the AS combination evaluation unit 22 determines a combination of AS candidates forming the minimum spanning tree as a combination of AS candidates in which links between all sites are reachable ("YES" at Step S203) and stores the AS candidate combination in question and information of AS links forming the minimum spanning tree in question in the reachable combination storage unit 32 (Step S204) to proceed to Step S205.

When the minimum spanning tree fails to include all the sites, the AS combination evaluation unit 22 determines that the combination of AS candidates forming the minimum spanning tree is not a combination of AS candidates in which links between all the sites are reachable ("NO" at Step S203) to proceed to Step S205.

Next, the AS combination evaluation unit 22 checks whether all the patterns of combinations of AS candidates each used by each site are processed (Step S205).

When all the patterns of combinations of AS candidates each used by each site are processed ("YES" at Step S205), the AS combination evaluation unit 22 proceeds to Step S206.

When not all the patterns of combinations of AS candidates each used by each site are processed ("NO" at Step S205), the AS combination evaluation unit 22 returns to Step S202 to repeat Steps S202 to Step S205 until all the patterns of combinations of AS candidates each used by each site are processed.

After processing all the patterns of combinations of AS candidates each used by each site ("YES" at Step S205), the optimization processing unit 23 refers to the reachable combination storage unit 32 to check whether there exists at least one combination of AS candidates in which links between all the sites are reachable (Step S206).

When there exists at least one combination of AS candidates in which links between all the sites are reachable ("YES" at Step S206), the optimization processing unit 23 calculates a combination of ASs whose objective function is to be optimized and outputs the AS combination in question to the output device 4 (Step S207) to end the operation.

When there exists no combination of reachable ASs ("NO" at Step S206), the optimization processing unit 23 outputs to the effect that designing is impossible to the output device 4 (Step S208) to end the operation.

(Description of Optimum as Combination Calculating Operation)

Figure 3:
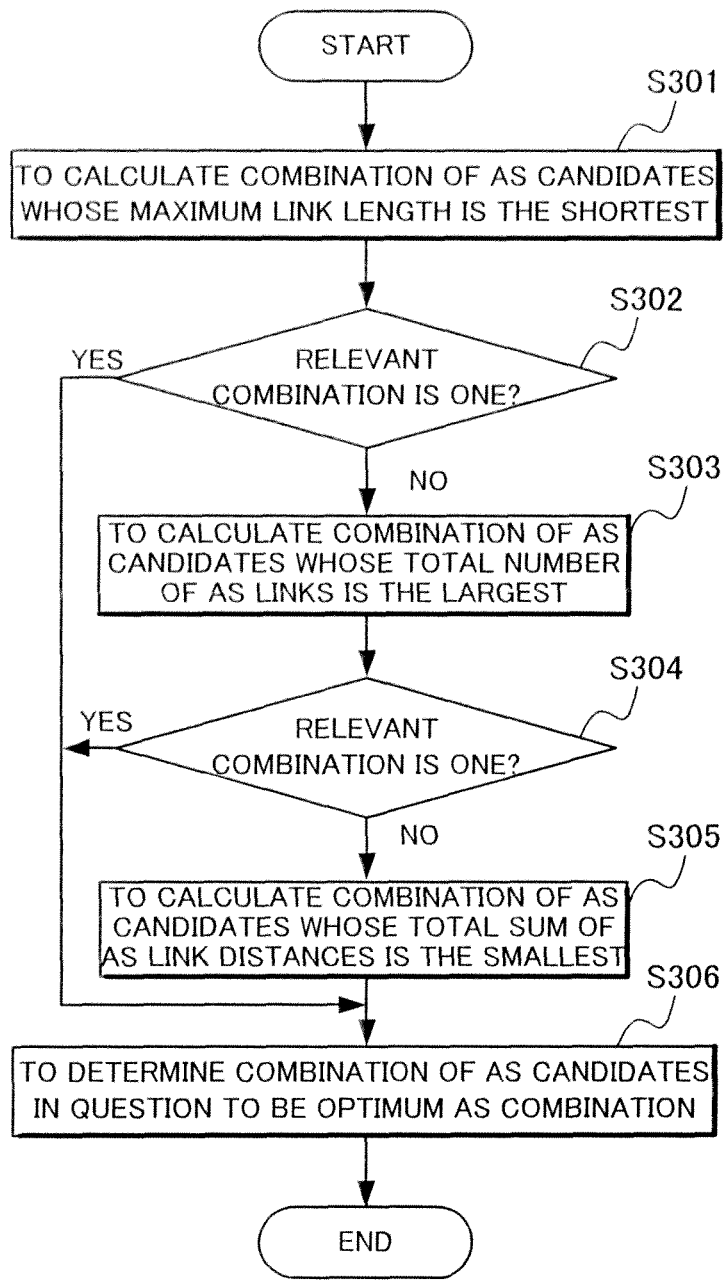
FIG. 3 is a flow chart showing operation of calculating an optimum AS combination according to the first the exemplary embodiment of the present invention.

In the following, detailed description will be made of a specific method of calculating an optimum AS combination at Step S207 of FIG. 2 with reference to FIG. 3. FIG. 3 is a flow chart showing operation of calculating an optimum AS combination according to the present exemplary embodiment. Object of design considered in the present exemplary embodiment is to maximize a worst value of end-to-end data transfer throughput.

First, the optimization processing unit 23 evaluates a maximum value of cost of the AS links forming a minimum spanning tree corresponding to each AS candidate combination stored at Step S204 as an objective function to obtain an AS candidate combination in which the maximum value of cost of an AS link will be the smallest among combinations of all the AS candidates (Step S301).

Maximum value of link cost represents a distance of a link between ASs which goes to the largest (largest link distance).

This intends to maximize a minimum value of an end-to-end throughput S between transmission and reception sites under a condition where for transferring HTTP data between certain transmission and reception sites, for example, each relay site operates as an HTTP proxy and sites at the opposite ends of an AS link terminate TCP.

Description will be here made of a background where a largest link distance gives a minimum value of the throughput S.

First, as the throughput S, a minimum value of a throughput on each AS link included in an end-to-end path is given.

Throughput on each AS link, since TCP is terminated between sites at the opposite ends of the link, is in inversely proportional to RTT affected by a distance between sites which terminate the AS link at the opposite ends (cost applied to the AS link).

Accordingly, since the longer the distance between sites becomes, the smaller becomes the minimum value of the throughput S, the minimum value of the throughput S between the respective transmission and reception sites is determined by the largest link cost (the largest link distance) included in its AS graph.

In order to minimize the maximum link cost while maintaining connectivity of an applied AS graph, an AS link having the largest cost will be sequentially removed within a range where connectivity is maintained. Ultimately obtained by this procedure is considered to be equivalent to a minimum spanning tree although none of its evidence is shown.

Listed as reference literature for the above description is Non-Patent Literature 4.

Since if a minimum spanning tree is extracted, connectivity can be determined, a minimum spanning tree is extracted at Step S202 earlier than evaluation of an objective function at Step S207.

As a result of Step S301, when there is one combination of AS candidates which minimizes the largest link distance ("YES" at Step S302), the optimization processing unit 23 determines the combination of AS candidates in question to be an optimum AS combination to be used in each site (Step S306).

As a result of Step S301, when there are a plurality of combinations of AS candidates which minimize the maximum link distance ("NO" at Step S302), the optimization processing unit 23, with respect to the plurality of AS candidate combinations which minimize the maximum link distance, considers the total number of AS links forming the minimum search tree corresponding to each AS candidate combination as an objective function to obtain an AS candidate combination whose total number of AS links in question is the largest (Step S303).

Here, obtaining a combination of AS candidates whose total number of AS links is the largest at Step S303 intends to take more transfer paths between certain sites and to select a more appropriate path at the time of a failure or congestion.

As a result of Step S303, when there is one combination of AS candidates which maximizes the total number of AS links ("YES" at Step S304), the optimization processing unit 23 determines the combination of AS candidates in question to be an optimum AS combination to be used in each site (Step S306).

As a result of Step S303, when there are a plurality of combinations of AS candidates which maximize the total number of AS links ("NO" at Step S304), the optimization processing unit 23, with respect to the plurality of AS candidate combinations which maximize the total number of AS links, considers the total sum of distances of AS links forming the minimum search tree corresponding to each AS candidate combination as an objective function to obtain an AS candidate combination whose total sum of distances of the AS links in question is the smallest (Step S305). The optimization processing unit 23 determines the obtained combination of AS candidates to be an optimum AS combination to be used in each site (Step S306).

Thus, when there are a plurality of optimum solutions of a first objective function, the optimization processing unit 23 evaluates a second objective function with respect to a plurality of AS candidate combinations which will be an optimum solution of the first objective function, and when there are a plurality of optimum solutions of the second objective function, evaluates a third objective function for a plurality of AS candidate combinations which will be an optimum solution of the second objective function and considers an AS candidate combination which will be an optimum solution of the third objective function as an optimum AS combination.

Accordingly, in the present exemplary embodiment, information related to a method of calculating first, second and third objective functions is stored in the design information storage unit 31.

First Example

Next, operation of the present exemplary embodiment will be described with respect to a specific example.

(Description of Structure)

Figure 4:
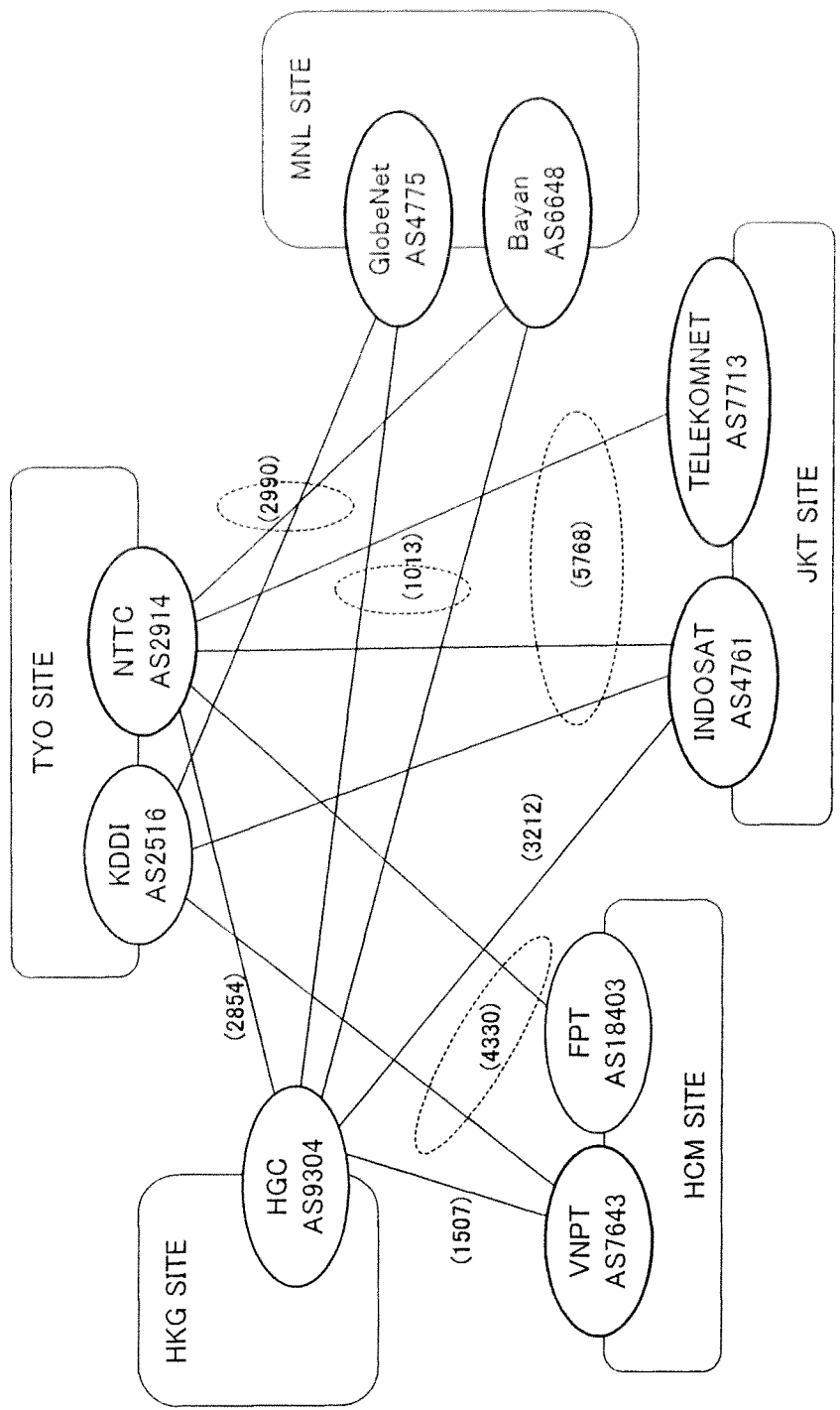
FIG. 4 is a diagram showing a design problem as a specific example for which operation of the network designing system according to the first exemplary embodiment of the present invention is to be executed.

FIG. 4 shows an example of a design problem indicating five sites of TYO, HKG, HCM, JKT and MNL, AS candidates applied to the respective sites, a connection relationship between AS candidates and a distance between the sites.

Figures 5, 6:
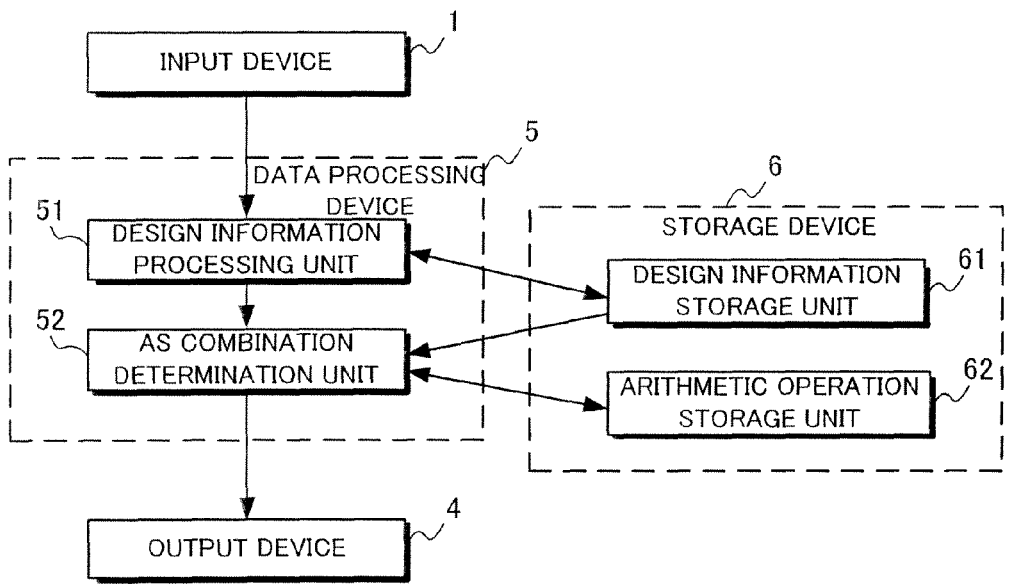
FIG. 5 is a diagram showing a specific example of operation of the network designing system according to the first exemplary embodiment of the present invention.
FIG. 6 is a block diagram showing s structure of a network designing system according to a second exemplary embodiment of the present invention.

FIG. 5 shows a result obtained by applying the above-described operation of the present exemplary embodiment to the example of the design problem shown in FIG. 4. The result is stored in the reachable combination storage unit 32.

(TYO, HCM, JKT, MNL) shown here in FIG. 5 indicates a combination of ASs selected by the respective sites. Since the HKG site has only one AS candidate, it is omitted from combination elements.

For the simplification of expression of a combination, AS to be selected in each site is replaced by 0 or 1 in FIG. 5 as shown in the following:

TYO site: AS2516=0, AS2914=1;

HCM site: AS7643=0, AS18403=1;

JKT site: AS4761=0, AS7713=1; and

MNL site: AS4775=0, AS6648=1.

(Description of Operation)

Next, description will be made of contents of the table shown in FIG. 5 and a process of optimization.

In a minimum spanning tree corresponding to a combination of AS candidates whose reachability between all the sites is checked by the AS combination evaluation unit 22, first, the optimization processing unit 23 evaluates a maximum value of cost of an AS link (distance between cities) as a first objective function.

With reference to FIG. 5, a combination which minimizes the cost maximum value of an AS link (Max link length) includes two, (1, 0, 0, 0) and (1, 0, 0, 1).

Accordingly, the optimization processing unit 23 next evaluates a total number of AS links as a second objective function.

While the number of AS links (# of links) of (1, 0, 0, 0) is five, the number of AS links of (1, 0, 0, 1) is six, so that (1, 0, 0, 1) will be a solution of the problem.

The optimization processing unit 23 therefore determines that the AS combination (1, 0, 0, 1), that is, (AS2914, AS9304, AS7643, AS4761, AS6648) is an AS combination to be used by each site.

Effects of the First Exemplary Embodiment

Effects of the present exemplary embodiment will be described in the following.

According to the present exemplary embodiment, by explicitly optimizing a given objective function, an optimum AS combination can be determined which enables data transfer with high throughput.

This enables designing of a network which allows data transfer with high throughput to be executed between servers.

The reason is that since on a data transfer path between sites, no other ASs than those used by each of the sites are included in the data transfer path, the number of hops of the data transfer path is reduced and RTT at the time of transfer between sites is reduced, thereby reducing a chance of a packet loss.

Figure 13:
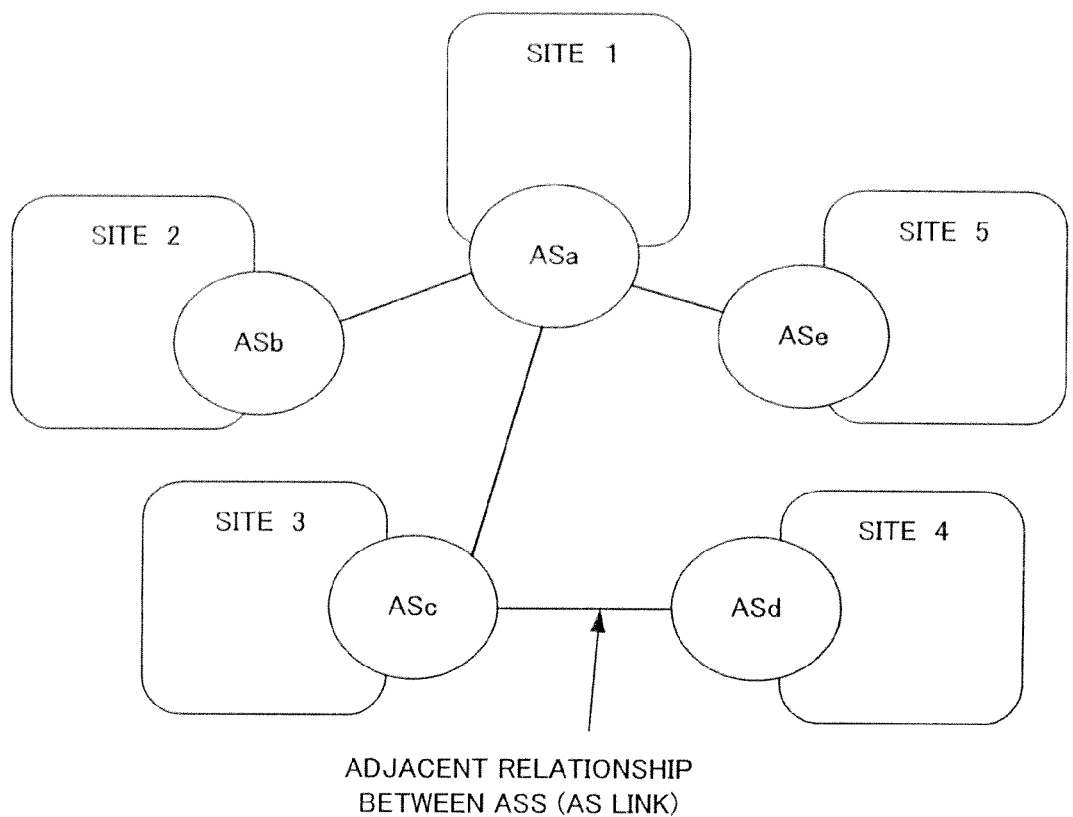
FIG. 13 is a diagram for use in explaining the principle of the present invention.

In FIG. 13, for example, with an AS combination (ASa, ASb, ASc, ASd, ASe) applied to sites 1 to 5, from the site 2 to the site 4, for example, a path ASb→ASa→ASc→ASd is established, which has more improved throughput than that in a case where a large number of other ASs than those of the combination are included between the ASb and ASd.

The present exemplary embodiment also enables performance such as throughput to be improved cost-effectively.

The reason is that for setting up a network which links all the sites, none of a high-cost dedicated line, IP-VPN and a virtual private network such as a wide area Ethernet is used.

Second Exemplary Embodiment

Next, a network designing system 100 according a second exemplary embodiment of the present invention will be detailed with reference to the drawings.

While in the first exemplary embodiment, so-called complete search for optimizing an objective function is executed under a given constraint condition, in the present exemplary embodiment, a combination of ASs to be used by each site is obtained by a heuristic method called constrained Prim's algorithm.

Prim's algorithm is one of methods for obtaining a minimum spanning tree. As an algorithm, a node to be newly added to a subtree already obtained is selected such that cost of a link from a node in a current subtree to a node connecting to the same will be minimum. This processing will be recursively executed until no further node to be added remains.

In the present exemplary embodiment, prioritization is executed with respect to sites included in design information whose details will be described later.

Site priority is based on the order of degrees of sites (site degree). More specifically, all the sites included in design information are given priority in the descending order of site degrees.

Site degree here is assumed to be a largest degree of an AS (AS degree) in each site. AS degree represents the total number of other ASs with which each AS has a connection, that is, the total number of AS links extending from a certain AS.

When there are sites whose site degrees are equal in prioritization, with respect to sites whose site degrees are equal, AS numbers of ASs which give a degree of a site in each site (i.e. AS whose AS degree is the largest in each site) are respectively compared to prioritize the sites in the ascending order of the AS numbers in question.

In each site, AS prioritization is executed first in the descending order of AS degrees of then ASs and when a plurality of ASs whose AS degrees are equal exist, prioritization is executed with respect to the plurality of ASs in the ascending order of AS numbers.

In the present exemplary embodiment, based on information of priority (priority information) obtained by the above-described method, a subtree is created by a constrained Prim's algorithm to which the following constraints are given.

First constraint is to give highest site priority to a site at which generation of a subtree is started. When there are a plurality of AS links whose link costs to be added next are equal according to the Prim's algorithm, select a site whose priority is the highest among sites linked with the AS links in question as a site to be added.

Second constraint is to select, when a plurality of reachable AS candidates exist in a site determined as a site to be added next according to the Prim's algorithm, an AS whose priority is the highest among the plurality of AS candidates in question.

Third constraint is to delete, after selecting one AS in a certain site, other AS candidates in the site and an AS link connecting to other AS candidates in question. Then, when entering and going out from the site, the selected AS should be passed through.

Figure 8:
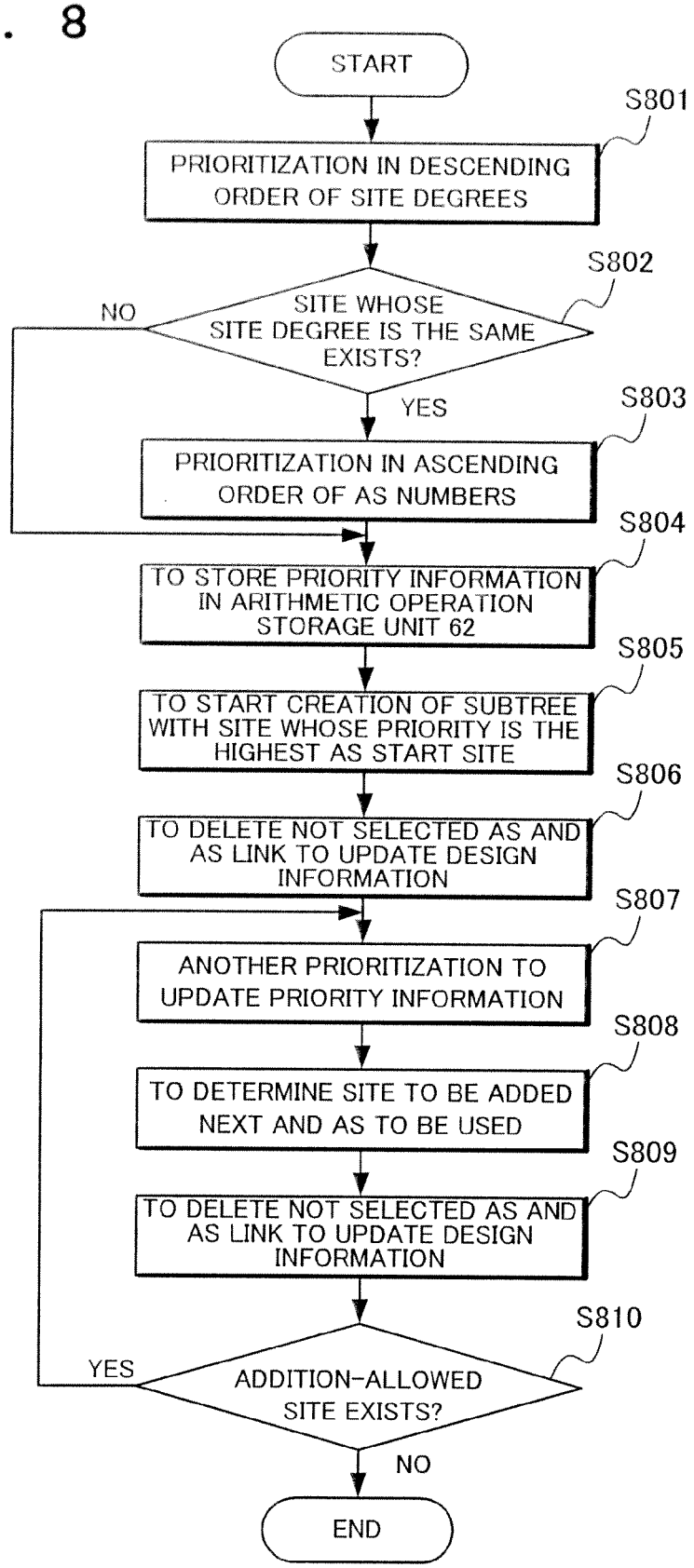
FIG. 8 is a flow chart showing operation of generating a subtree according to the second exemplary embodiment of the present invention.

By the above-described third constraint, deletion of an AS not selected and an AS link connecting to the AS in question might decrease the degree of an AS in each site. Therefore, assume that at every deletion of an AS not selected by the third constraint and a link extending from the AS in question, prioritization processing shown in FIG. 8 is executed with respect to a site yet to be added to the subtree to recalculate priority.

With reference to FIG. 6, the network designing system 100 according to the second exemplary embodiment of the present invention includes the input device 1, a data processing device 5, a storage device 6 and the output device 4.

Since the input device 1 and the output device 4 are the same as the input device 1 and the output device 4 of the first exemplary embodiment shown in FIG. 1, no detailed description will be made thereof.

The data processing device 5 comprises a design information processing unit 51 and an AS combination determination unit 52.

The design information processing unit 51 creates an input format to be displayed on the output device 4 for a designer to input design information.

The design information processing unit 51 executes processing of converting design information input by a designer through the input device 1 according to the input format into a form which is easy for the AS combination determination unit 52 to process and storing the obtained information in a design information storage unit 61.

Design information here includes a site, an AS candidate applied to each site, existence/non-existence of a connection relationship between the respective AS candidates and when a connection relationship exists, cost applied to the connection relationship in question.

After storing design information converted into a form which is easy for the AS combination determination unit 52 to process in the design information storage unit 31, the design information processing unit 51 activates the AS combination determination unit 52.

The AS combination determination unit 52 extracts design information stored in the design information storage unit 61 and stores the same in an arithmetic operation storage unit 62.

The AS combination determination unit 52 determines a combination of ASs each one to be used by each site from given AS candidates by the constrained Prim's algorithm and simultaneously determines its reachability. The constrained Prim's algorithm will be detailed in the description of operation.

The storage device 6 comprises the design information storage unit 61 and the arithmetic operation storage unit 62.

Stored in the design information storage unit 61 is design information including a site, an AS candidate applied to each site, existence/non-existence of a connection relationship between the respective AS candidates and when a connection relationship exists, cost applied to the connection relationship in question.

In the arithmetic operation storage unit 62, design information is accumulated which includes such data to be updated by arithmetic operation processing based on the constrained Prim's algorithm by the AS combination determination unit 52 as a yet-to-be visited site and a link between ASs.

Description of Operation of the Second Exemplary Embodiment

Figure 7:
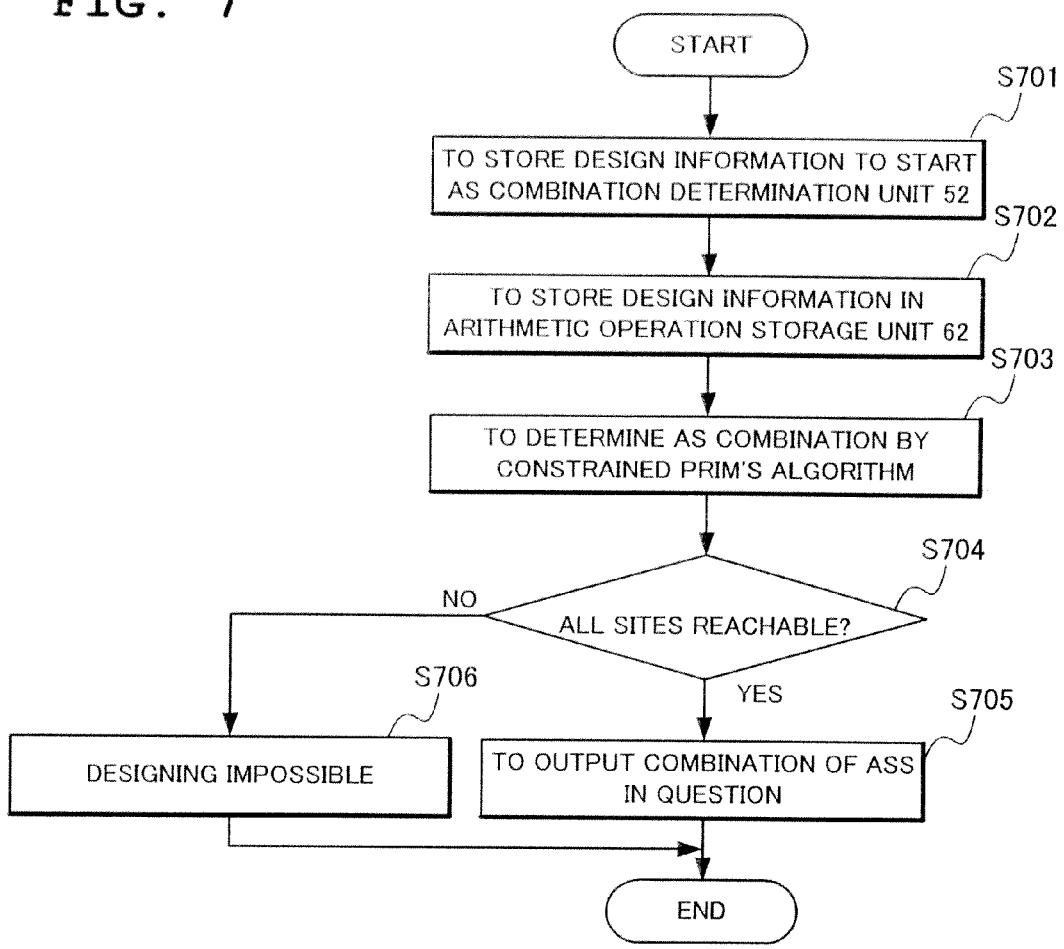
FIG. 7 is a flow chart showing operation of the network designing system according to the second exemplary embodiment of the present invention.

Next, detailed description will be made of operation of the present exemplary embodiment with reference to FIG. 6 and FIG. 7. FIG. 7 is a flow chart showing operation of the network designing system 100 according to the present exemplary embodiment.

First, the design information processing unit 51 displays an input format on a screen by the output device 4 and a designer inputs design information by using the input device 1 according to the input format. After inputting the design information, the design information processing unit 51 converts the design information into a storage format and stores the obtained information in the design information storage unit 61 to start the AS combination determination unit 52 (Step S701).

Next, the AS combination determination unit 52 takes out the design information stored in the design information storage unit 61 and stores the same in the arithmetic operation storage unit 62 (Step S702) to determine a combination of ASs each one to be used by each site by the constrained Prim's algorithm (Step S703). Specific operation of Step S703 will be described later.

After determining the combination of AS candidates each one to be used by each site (Step S703), the AS combination determination unit 52 refers to subtree information of the arithmetic operation storage unit 62 and the design information of the design information storage unit 61 in order to determine whether all the sites are reachable or not and checks whether the currently obtained subtree includes all the sites applied first as design information (Step S704). Subtree information will be described later.

In a case where the currently obtained subtree includes all the sites first applied as design information, the AS combination determination unit 52 determines that an AS combination selected when each site is applied to the subtree in question as an AS combination whose sites are all reachable ("YES" at Step S704) and outputs the AS combination in question to the output device 4 (Step S705) to end the operation.

In a case where the currently obtained subtree fails to include all the sites first applied as design information, the AS combination determination unit 52 determines that not all the sites are reachable by the AS combination selected when each site is applied to the subtree in question ("NO" at Step S704) to output design-disabled to the output device 4 (Step S706) to end the operation.

(Description of Operation of Subtree Generation)

Here, operation of Step S703 will be described with reference to FIG. 8. FIG. 8 is a flow chart showing operation of subtree generation according to the present exemplary embodiment.

With reference to FIG. 8, first the AS combination determination unit 52 prioritizes all the sites included in design information in the descending order of site degrees (Step S801).

As a result of Step S801, when there exist sites whose site degrees are equal ("YES" at Step S802), the AS combination determination unit 52 compares, with respect to sites whose site degrees are equal, AS numbers of ASs each of which gives a degree of a site in each site, that is, ASs each having the largest AS degree in each site to prioritize the sites in the ascending order of the AS numbers in question (Step S803).

Next, the AS combination determination unit 52 stores information of site priority in the arithmetic operation storage unit 62 (Step S804).

Next, the AS combination determination unit 52 refers to the arithmetic operation storage unit 62, selects a site whose priority is the highest as a start site and further selects an AS whose priority is the highest in the site in question to start generation of a subtree (Step S805).

Next, the AS combination determination unit 52 deletes an AS not selected and an AS link extending from the AS in question to update the design information stored in the arithmetic operation storage unit 62 based on information of the deleted AS and AS link (Step S806).

Next, the AS combination determination unit 52 refers to the design information of the arithmetic operation storage unit 62, with respect to all the sites yet to be added to the subtree, executes the same processing as that of Steps S801 to S804 and again prioritizes the sites to update the priority information stored in the arithmetic operation storage unit 62 (Step S807).

Next, the AS combination determination unit 52 refers to the design information of the arithmetic operation storage unit 62, determines a site to be added to the subtree next by the constrained Prim's algorithm, refers to the priority information of the arithmetic operation storage unit 62, determines an AS whose order is the highest in the site determined as a site to be added to the subtree next as an AS to be used in the site in question and adds the determined site to the subtree (Step S808).

More specifically, a site to be added next is a site yet to be added to the subtree, for which selected is a site whose link cost is the smallest among sites having AS candidates connecting to an AS link which extends from an AS of a site added to the subtree immediately before (immediately before added site).

Next, the AS combination determination unit 52 deletes an AS not selected in the site determined as a site to be added next to the subtree and an AS link connecting to the AS in question to update the design information stored in the arithmetic operation storage unit 62 based on the information of the deleted AS and AS link (Step S809).

Next, the AS combination determination unit 52 refers to the arithmetic operation storage unit 62 to check whether there exists a site which can be added next (addition-allowed site) (Step S810).

More specifically, the AS combination determination unit 52 searches for a site having an AS candidate connecting to an AS link extending from an AS of a site added immediately before and when no site is found which connects to the AS of the site added immediately before, returns to a site immediately precedent to the site added immediately before to similarly search for a site having an AS candidate connecting to an AS link extending from an AS of the immediately preceding site in question. Then, determine the site found by the above search as an addition-allowed site.

When determining that an addition-allowed site exists ("YES" at Step S810), the AS combination determination unit 52 returns to the processing of Step S807 to repeat the processing of Steps S807 to S810 until no further addition-allowed site remains and when determining at Step S810 that no addition-allowed site exists, the AS combination determination unit ends the operation of creating a subtree ("NO" at Step S810).

Example 2

Next, operation of the present exemplary embodiment will be described with reference to a specific example.

(Description of Structure)

Figure 9:
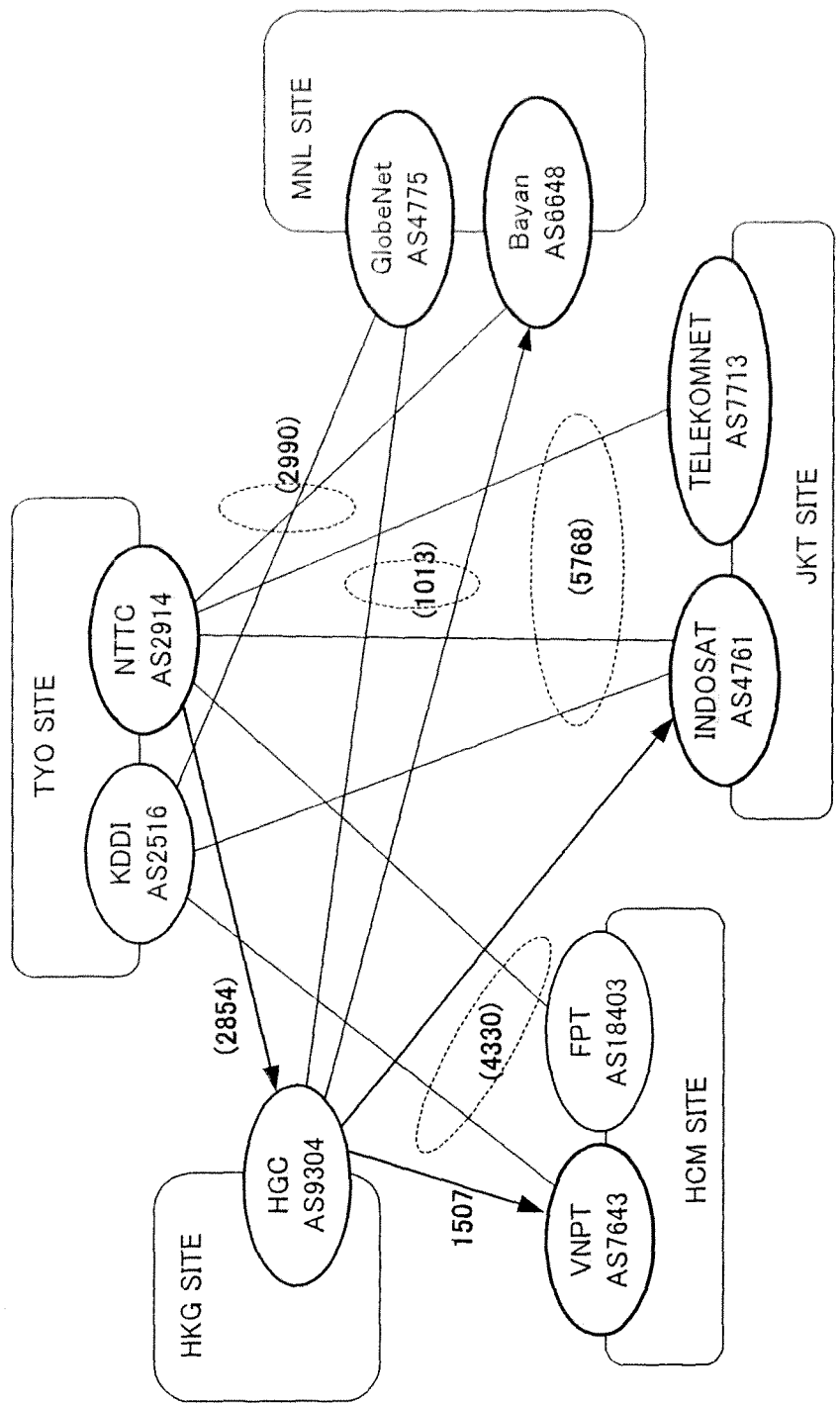
FIG. 9 is a diagram showing a specific example of operation of the network designing system according to the second exemplary embodiment of the present invention.

FIG. 9 shows a result obtained when the above-described operation of the present exemplary embodiment is applied to the example of the design problem given in FIG. 4. The result is stored in the arithmetic operation storage unit 62.

(Description of Operation)

In the following, description will be made of a procedure of obtaining a solution shown in FIG. 9 by the constrained Prim's algorithm according to the present exemplary embodiment.

First, giving priority to all the sites at Steps S801 to S804 of FIG. 8 will have a result as follows. Indication in a parenthesis represents an AS which gives a site degree.

TYO(AS2914)>HKG(AS9304)>JKT(AS4761)>MNL (AS4775)>HCM(AS7643)

First, at Step S805, the TYO site is selected as a start site of the subtree.

The reason for the selection of AS2914 at the TYO site is that while the AS degree of AS2516 is "3", the AS degree of AS2914 is "4".

Then, AS 2516 not selected at Step S806 and an AS link extending from AS2516 are deleted.

Next, after in prioritizing other sites than the TYO site at Step S807, determine a site to be added next to the subtree at Step S808.

Since an AS link extending from the TYO(AS2914) whose link cost is the smallest is TYO-HKG, add the HKG site to the subtree at Step S808 to update the design information at Step S809. Since the HKG site has only one AS existing, AS9304 will be necessarily an AS to be used.

Next, after confirming the addition-allowed site at Step S810, since AS links extending from HKG (AS9304) are three, MNL, JKT and HCM, return to Step S807.

Then, after again prioritizing other sites than the TYO site and the HKG site at Step S807, determine a site to be added next to the subtree at Step S808.

Again at Step S808, when considering the above-described three sites as a candidate to be added to the subtree of TYO-HKG, since the cost between TYO and MNL is the smallest, add the MNL site to select AS6648 whose priority is higher.

Similarly, add the HCM site from HKG to select the reachable AS7643 thereafter. Lastly, add the JKT site from HKG to select the reachable AS4761.

Effects of the Second Exemplary Embodiment

Effects of the present exemplary embodiment will be described.

According to the present exemplary embodiment, selecting an AS whose degree is high enables a possibility of increasing the number of paths that can be taken between the AS and other ASs to be increased.

According to the present exemplary embodiment, even when the number of sites or the number of AS candidates is increased, a combination of ASs to be used by the respective sites can be determined with a less amount of calculation than that of the first exemplary embodiment.

The reason is as follows.

With the number of sites as N, a maximum value of the number of ASs usable by each site as A and a maximum value of the total number of AS links in an AS combination as L, although a calculation amount (computational complexity) by an ordinary Prim's algorithm will be $L*\log N$, since in a constrained Prim's algorithm, every time a site is added, an AS usable by the site is sorted among the remaining sites, the calculation amount of the processing in question will be $O(N*A*\log A)$, so that the calculation amount by the constrained Prim's algorithm will be $O(L*N*\log N*A*\log A)$.

On the other hand, in the first exemplary embodiment, with the total number of AS combinations as $A^N$, when extracting the minimum spanning tree by the Prim's algorithm, the amount of calculation for the extraction will be $O(L*\log N)$, so that the amount of calculation for the extraction of the minimum spanning tree by the Prim's algorithm will be $O(A^N*L*\log N)$.

Accordingly, the second exemplary embodiment enables determination of a combination of ASs to be used by the respective sites by a less amount of calculation than that of the first exemplary embodiment.

In the above-described first and second exemplary embodiments, as to a connection relationship between AS candidates applied to the respective sites, information about the connection relationship can be obtained by the following manner.

From, for example, a site of CIDR REPORT (http://www-.cidr-report.org/am2.0/), information is obtained about a current connection relationship obtained from a router handling BGP.

From a site of AS relationship of CAIDA (http://www.caida.org/data/active/as-relationships/), obtained is up to a result of peering and estimation of transit.

Further, from a site of Robtex (http://www.robtex.com/), obtained is information about a connection relationship based on information registered in Internet Routing Registry.

Third Exemplary Embodiment

Next, a network designing system 100 according to a third exemplary embodiment of the present invention will be detailed.

In the present exemplary embodiment, designing is executed including a site dedicated to relay other than the sites from which data is transmitted or at which data is received in the first and second exemplary embodiments.

More specifically, an AS combination is calculated with the respective sites included in the design information applied at Step S201 of FIG. 2 and Step S701 of FIG. 7 discriminated as a site from which transmission is made or at which reception is made and a site dedicated to relay.

Then, in checking reachability at Step S203 of FIG. 2 and Step S704 of FIG. 7, confirmation of reachability at least between sites given as a transmission site or a reception site is assumed to obtain design. In other words, it is unnecessary to ensure reachability between all the relay sites applied and other sites applied.

Effects of the Third Exemplary Embodiment

Next, effects of the present exemplary embodiment will be described.

According to the present exemplary embodiment, applying a relay site other than transmission and reception sites improves data transfer throughput.

The reason is that assuming, for example, that in the problem example shown in FIG. 4, only the HKG site is a site dedicated to relay and the other sites are given as transmission and reception sites, in a case where the data transfer path includes the HKG site, the smallest value of the maximum link distance is 3212 as shown in FIG. 5.

On the other hand, in a case where the data transfer path fails to include the HKG site, 5768 between TYO and JKT will be the smallest value of the maximum link distance.

Accordingly, contrarily including the HKG site dedicated to relay enables reduction of the smallest value of the maximum link distance from 5768 to 3212 to improve data transfer throughput.

Fourth Exemplary Embodiment

Next, a network designing system 100 according to a fourth exemplary embodiment of the present invention will be detailed with reference to the drawings.

In a case of transferring data between a transmission site and a reception site by a path based on an AS graph obtained by the first and second exemplary embodiments, when the transmission site transfers a packet whose IP address is set at the reception site onto the Internet without change, if no connection relationship exists between ASs respectively used by the transmission site and the reception site, the packet will be transferred according to BGP path control and not always be transferred on a path intended by the designing method provided by the present invention.

In the present exemplary embodiment, therefore, when transferring HTTP data between a transmission site and a reception site, each relay site is operated as a proxy which terminates TCP and takes out HTTP data.

Moreover, when each of a plurality of sites requests the same data, each relay site is operated as a proxy cache so as to return the data at every request.

Then, it is set such that when a domain name corresponding to an origin site is applied, each edge site is allowed to transfer data based on a path between the transmission and reception sites that can be set on the AS graph obtained by the design.

When each site uses Squid as recited in the Non-Patent Literature 5, a next transfer destination of an HTTP get request is set as a "parent" of the proxy with respect to a domain included in URL required by the HTTP get request.

Then, when a plurality of paths exist between certain transmission and reception sites, a path whose maximum value of a distance of an AS link included in the path is the smallest is preferentially selected.

Distance of an AS link is here given by a distance between sites which terminate the AS link in question at the opposite ends. The reason is the same as that for the maximization of an end-to-end TCP throughput at the time of designing.

Description will be made of a method of determining a distribution path to the MNL site as an edge site, with the TYO site as an origin site in a design example shown in FIG. 9, for example.

Although between the TYO site and the MNL site, there are a one-hop path of TYO-MNL (2990 km) and a two-hop path of TYO-HKG-MNL (2854 km+1013 km), because the two-hop path of TYO-HKG-MNL has a maximum link distance shorter than the other, the two-hop path of TYO-HKG-MNL will be preferentially used to the one-hop TYO-MNL.

When each site uses Squid as recited in the Non-Patent Literature 5, at the MNL site, the HKG site and the TYO site are set to be a parent such that weights applied to the respective sites have a relationship HKG>TYO.

Effects of the Fourth Exemplary Embodiment

Next, effects of the present exemplary embodiment will be described.

According to the present exemplary embodiment, in a case of transferring data between a transmission site and a reception site by a path based on an AS graph obtained by the first and second exemplary embodiments, when the transmission site transfers a packet whose IP address is set at the reception site onto the Internet without change, even if no connection relationship exists between ASs respectively used by the transmission site and the reception site, the packet will be transferred according to a path based on the AS graph in question.

While in the above-described first to fourth exemplary embodiments, each site takes an AS forming the Internet as an operation unit of a network to be selected/determined, a possible network operation unit based on other technique is an Ethernet domain discussed in MEF (Metro Ethernet Forum) shown in the Non-Patent Literature 6.

In the discussion, as a method of connection between Ethernet domains by different carriers or operators, standardization of E-NNI is also discussed.

Listed as reference literature related to the above description are the Non-Patent Literature 5 and the Non-Patent Literature 6.

Figure 10:
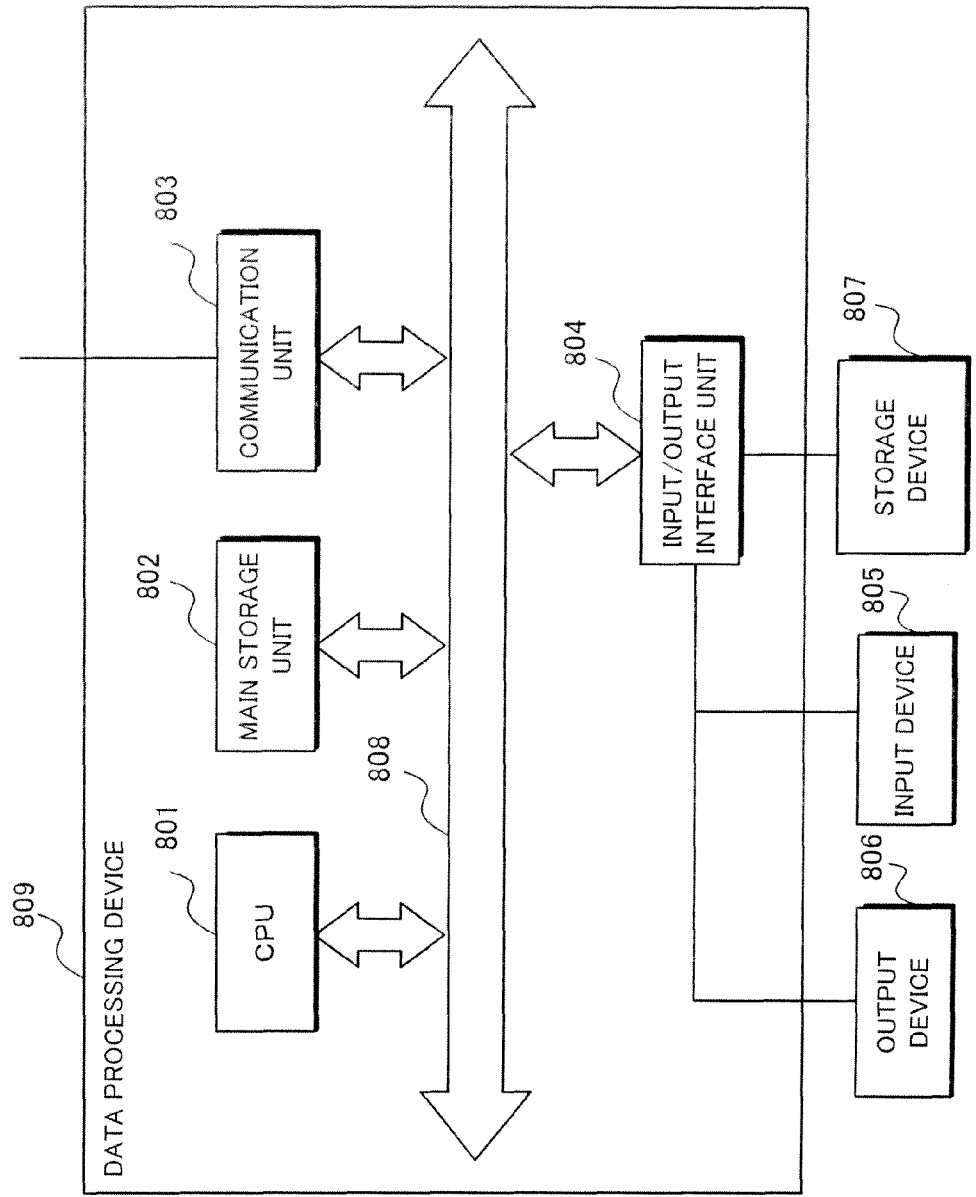
FIG. 10 is a block diagram showing an example of a hardware structure of a network designing system of the present invention.
Figure 11:
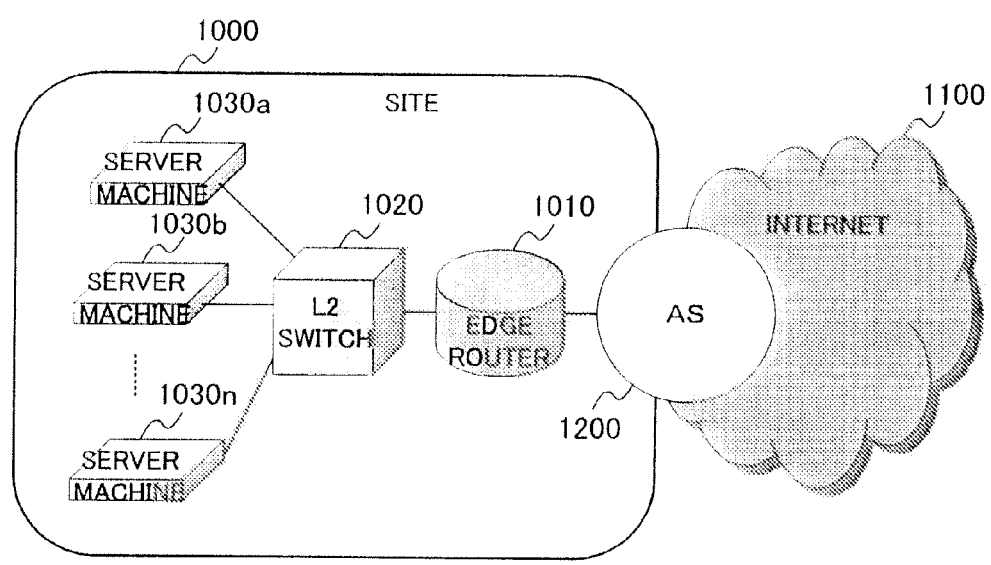
FIG. 11 is a diagram showing an example of a structure of a site.
Figure 12:
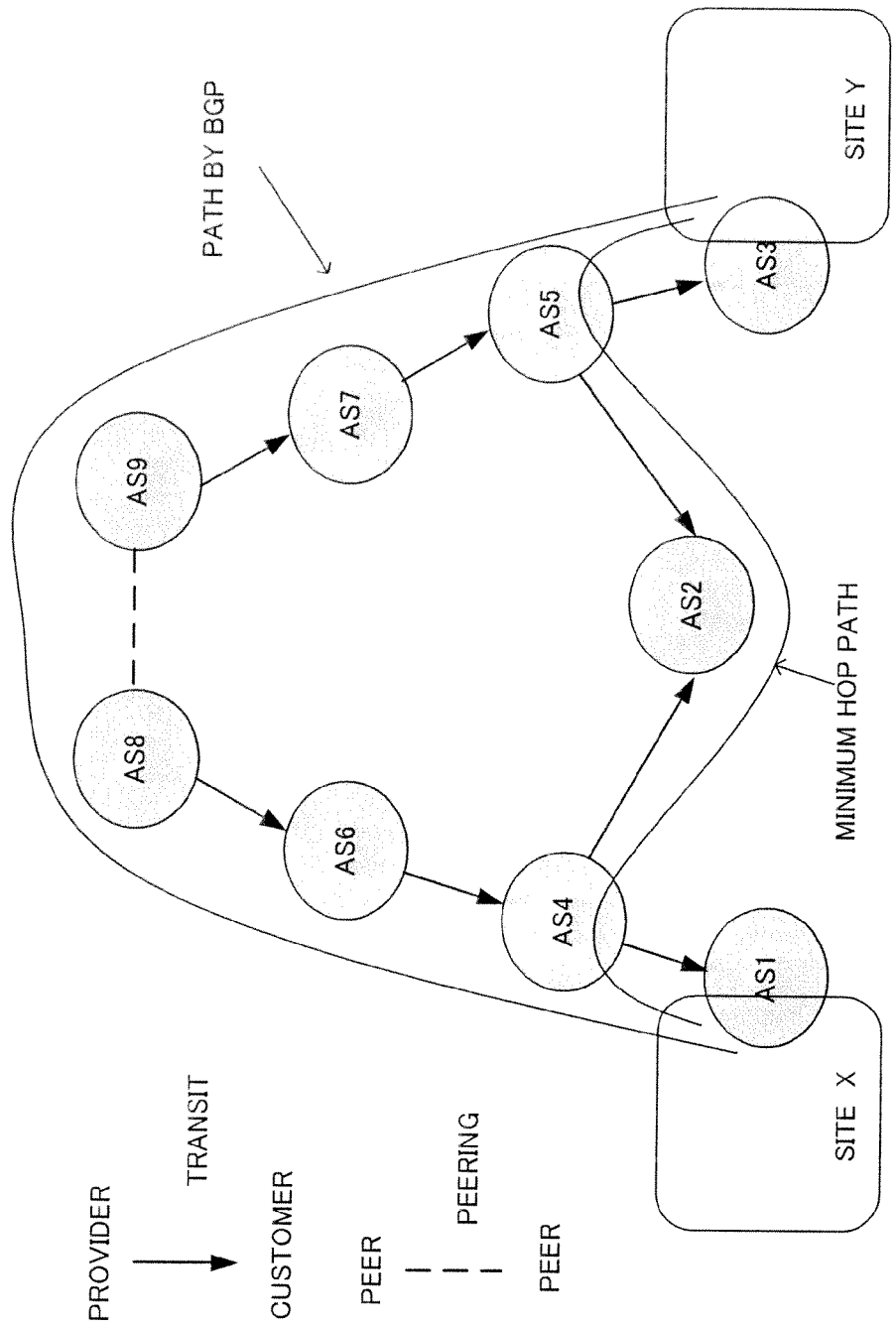
FIG. 12 is a diagram for use in explaining routing hierarchy in the Internet.

Next, description will be made of a hardware structure example of the network designing system 100 according to the present invention with reference to FIG. 10. FIG. 10 is a block diagram showing the hardware structure example of the network designing system 100.

With reference to FIG. 10, the network designing system 100, which has the same hardware structure as that of a common computer device, comprises a CPU (Central Processing Unit) 801, a main storage unit 802 formed of a memory such as a RAM (Random Access Memory) for use as a data working region or a data temporary saving region, a communication unit 803 which transmits and receives data through a network, an input/output interface unit 804 connected to an input device 805, an output device 806 and a storage device 807 to transmit and receive data, and a system bus 808 which connects each of the above-described components with each other. The storage device 807 is realized by a hard disk device formed of a non-volatile memory, for example, a ROM (Read Only Memory), a magnetic disk or a semiconductor memory, or the like.

A data processing device 809 of the network designing system 100 of the present invention has its operation realized not only in hardware by mounting a circuit part as a hardware part such as an LSI (Large Scale Integration) with a program incorporated but also in software by storing a program which provides the function in the storage device 807, loading the program into the main storage unit 802 and executing the same by the CPU 801.

INCORPORATION BY REFERENCE

This application is based upon and claims the benefit of priority from Japanese patent application No. 2009-195499, filed on Aug. 26, 2009, the disclosure of which is incorporated herein in its entirety by reference.

INDUSTRIAL APPLICABILITY

The present invention is applicable to such use as providing service of delivering contents or applications from a plurality of server sites or data centers disposed in a geographically distributed manner on the Internet formed of numerous ASs as a network operation unit.

The present invention is applicable not only to distribution of contents from an origin site to an edge site but also to application delivery of transferring a result of processing obtained by an application of the origin server to a Web client of an end user through one or a plurality of relay sites.

Although the present invention has been described with respect to the preferred exemplary embodiments in the foregoing, the present invention is not necessarily limited to the above-described exemplary embodiments but can be implemented in variation without departing from the scope of its technical idea.

What is claimed is:

1. A network designing method, comprising:
   determining, with respect to a candidate of a network operation unit from among a plurality of network operating units applied at least one to each site of a plurality of sites forming a network, a combination of said network operation units each one of which is to be used by each site such that all the sites become reachable based on a connection relationship checked before the determining, and applied to each pair of the candidates of said network operation units between different sites,
   wherein only one said network operation unit, which is used by each site to connect to one or more other sites, is selected from the plurality of said network operation units of the site of the plurality of sites,
   wherein a combination of said network operation units to be used by each site is determined by generating a minimum spanning tree based on a cost applied between each of said network operation units paired which are connected with each other between different sites,
   checking whether or not said minimum spanning tree includes all the sites; and calculating a combination of said network operation units which minimizes a maximum value of said cost in said minimum spanning tree,
   wherein the said network operation unit comprises an autonomous system forming the Internet, the autonomous system including a set of individual routers and end systems, and having a unique number in the Internet,
   wherein the cost includes a distance between each of the pair of the candidates of said network operation units between different sites, and
   wherein said network operation unit to be used is determined every time a site is sequentially selected, and said network operation unit to be used in said site to be newly selected is determined based on a total number of connection relationships given in advance with said network operation unit of other site.

2. A network designing method, comprising:
   determining, with respect to a candidate of a network operation unit from among a plurality of network operating units applied at least one to each site of a plurality of sites which transmit or receive data and a plurality of sites which execute only relay, the sites of which form a network, a combination of said network operation units each one of which is to be used by each site such that all the sites which execute at least data transmission or reception become reachable based on a connection relationship checked beforehand of the determining, and applied to each pair of the candidates of said network operation units between different sites,
   wherein only one said network operation unit, which is used by each site to connect to one or more other sites, is selected from the plurality of said network operation units of the site of the plurality of sites,
   wherein each of the plurality of network operation unit comprises the autonomous system including the set of individual routers and end systems, and having the unique number in the Internet, the Internet structured with a plurality of the autonomous systems serviced, each as a unit of a network operated by an Internet service provider.

3. The network designing method according to claim 1, wherein a combination of said network operation units each one of which is to be used by each site is determined by further calculating a combination of said network operation units which maximizes a total number of connection relationships each of which each pair of said network operation units has,
   wherein each of the plurality of network operation unit comprises the autonomous system including the set of individual routers and end systems, and having the unique number in the Internet, the Internet structured with a plurality of the autonomous systems serviced, each as a unit of a network operated by an Internet service provider.

4. The network designing method according to claim 3, wherein a combination of said network operation units each one of which is to be used by each said site is determined by further calculating a combination of said network operation units which minimizes a total sum of costs applied between each said network operation units paired which are connected with each other.

5. The network designing method according to claim 1, a site to be newly selected is determined based on a Prim's algorithm.

6. The network designing method according to claim 1, wherein said network operation unit comprises an Ethernet domain.

7. A data transfer path determination method, comprising:
   determining a path for transferring data from a certain transmission site to another reception site based on a connection relationship given in advance to each pair of said network operation units which is obtained by the network designing method according to claim 1.

8. The data transfer path determination method according to claim 7, wherein when distributing HTTP (Hyper Text Transfer Protocol) data to other at least one site from a certain site, each site on a distribution path is operated as a proxy server or a cache server of HTTP.

9. A network designing system, comprising:
   a processing unit which determines, with respect to a candidate of a network operation unit from among a plurality of network operating units applied at least one to each site of a plurality of sites forming a network, a combination of said network operation units each one of which is to be used by each site such that all the sites become reachable based on a connection relationship checked beforehand of the processing unit determining, and applied to each pair of the candidates of said network operation units between different sites, wherein only one said network operation unit, which is used by each site to connect to one or more other sites, is selected from the plurality of said network operation units of the site-of the plurality of sites, wherein a combination of said network operation units to be used by each site is determined by generating a minimum spanning tree based on a cost applied between each of said network operation units paired which are connected with each other between different sites, wherein the processing unit checks whether or not said minimum spanning tree includes all the sites, and calculates a combination of said network operation units which minimizes a maximum value of said cost in said minimum spanning tree, wherein the said network operation unit includes an autonomous system forming the Internet, the autonomous system including a set of individual routers and end systems, and having a unique number in the Internet, wherein the cost includes a distance between each of the pair of the candidates of said network operation units between different sites, and wherein said network operation unit to be used is determined every time a site is sequentially selected, and said network operation unit to be used in said site to be newly selected is determined based on a total number of connection relationships given in advance with said network operation unit of other site.

10. A network designing system, comprising:
a processing unit which determines, with respect to a candidate of a network operation unit from among a plurality of network operating units applied at least one to each site of a plurality of sites which transmit or receive data and a plurality of sites which execute only relay, the sites of which form a network, a combination of said network operation units each one of which is to be used by each site such that all the sites which execute at least data transmission or reception become reachable based on a connection relationship checked before the determining by the processing unit, and applied to each pair of the candidates of said network operation units between different sites, wherein only one said network operation unit, which is used by each site to connect to one or more other sites, is selected from the plurality of said network operation units of the site of the plurality of sites, wherein a combination of said network operation units to be used by each site is determined by generating a minimum spanning tree based on a cost applied between each of said network operation units paired which are connected with each other between different sites, wherein the processing unit checks whether or not said minimum spanning tree includes all the sites, and calculates a combination of said network operation units which minimizes a maximum value of said cost in said minimum spanning tree, wherein the said network operation unit includes an autonomous system forming the Internet, the autonomous system including a set of individual routers and end systems, and having a unique number in the Internet, wherein the cost includes a distance between each of the pair of the candidates of said network operation units between different sites, and wherein said network operation unit to be used is determined every time a site is sequentially selected, and said network operation unit to be used in said site to be newly selected is determined based on a total number of connection relationships given in advance with said network operation unit of other site.

11. The network designing system according to claim 9, wherein said processing unit determines a combination of said network operation units each one of which is to be used by each site by creating a minimum spanning tree based on a cost applied between each said network operation units paired which are connected with each other between different sites and calculating a combination of said network operation units which minimizes a maximum value of said cost in said minimum spanning tree.

12. The network designing system according to claim 11, wherein said processing unit determines a combination of said network operation units each one of which is to be used by each site by further calculating a combination of said network operation units which maximizes a total number of connection relationships each of which each pair of said network operation units has.

13. The network designing system according to claim 12, wherein said processing unit determines a combination of said network operation units each one of which is to be used by each said site by further calculating a combination of said network operation units which minimizes a total sum of costs applied between each said network operation units paired which are connected with each other.

14. The network designing system according to claim 9, wherein said processing unit determines said network operation unit to be used every time a site is sequentially selected, determines a site to be newly selected based on a Prim's algorithm and determines said network operation unit to be used in said site to be newly selected based on a total number of connection relationships given in advance with said network operation unit of other site.

15. The network designing system according to claim 9, wherein said network operation unit comprises an autonomous system forming the Internet.

16. The network designing system according to claim 9, wherein said network operation unit comprises an Ethernet domain.

17. A non-transitory computer-readable medium storing a network designing program, wherein said network designing program causes a computer to execute determination processing of determining, with respect to a candidate of a network operation unit applied at least one to each site of a plurality of sites forming a network, a combination of said network operation units each one of which is to be used by each site such that all the sites become reachable based on a connection relationship checked before the determining, and applied to each pair of the candidates of said network operation units between different sites, wherein only one said network operation unit, which is used by each site to connect to one or more other sites, is selected from the plurality of said network operation units of the site of the plurality of sites, wherein a combination of said network operation units to be used by each site is determined by generating a minimum spanning tree based on a cost applied between each of said network operation units paired which are connected with each other between different sites;

checking whether or not said minimum spanning tree includes all the sites, and calculating a combination of said network operation units which minimizes a maximum value of said cost in said minimum spanning tree, wherein the said network operation unit includes an autonomous system forming the Internet, the autonomous system including a set of individual routers and end systems, and having a unique number in the Internet, wherein the cost includes a distance between each of the pair of the candidates of said network operation units between different sites, and wherein said network operation unit to be used is determined every time a site is sequentially selected, and said network operation unit to be used in said site to be newly selected is determined based on a total number of connection relationships given in advance with said network operation unit of other site.

18. A non-transitory computer-readable medium storing a network designing program, wherein said network designing program causes a computer to execute determination processing, comprising:

determining, with respect to a candidate of a network operation unit from among a plurality of network operating units applied at least one to each site of a plurality of sites which transmit or receive data and a plurality of sites which execute only relay, the sites of which form a network, a combination of said network operation units each one of which is to be used by each site such that all the sites which execute at least data transmission or reception become reachable based on a connection relationship checked before the determining, and applied to each pair of the candidates of said network operation units between different sites, wherein only one said network operation unit, which is used by each site to connect to one or more other sites, is selected from the plurality of said network operation units of the site of the plurality of sites, wherein a combination of said network operation units to be used by each site is determined by generating a minimum spanning tree based on a cost applied between each of said network operation units paired which are connected with each other between different sites;

checking whether or not said minimum spanning tree includes all the sites; and calculating a combination of said network operation units which minimizes a maximum value of said cost in said minimum spanning tree, wherein the said network operation unit includes an autonomous system forming the Internet, the autonomous system including a set of individual routers and end systems, and having a unique number in the Internet, wherein the cost includes a distance between each of the pair of the candidates of said network operation units between different sites, and wherein said network operation unit to be used is determined every time a site is sequentially selected, and said network operation unit to be used in said site to be newly selected is determined based on a total number of connection relationships given in advance with said network operation unit of other site.

19. The non-transitory computer-readable medium according to claim 17, wherein in said determination processing, a combination of said network operation units each one of which is to be used by each site is determined by creating a minimum spanning tree based on a cost applied between each said network operation units paired which are connected with each other between different sites and calculating a combination of said network operation units which minimizes a maximum value of said cost in said minimum spanning tree.

20. The non-transitory computer-readable medium according to claim 19, wherein in said determination processing, a combination of said network operation units each one of which is to be used by each site is determined by further calculating a combination of said network operation units which maximizes a total number of connection relationships each of which each pair of said network operation units has.

21. The non-transitory computer-readable medium according to claim 20, wherein in said determination processing, a combination of said network operation units each one of which is to be used by each said site is determined by further calculating a combination of said network operation units which minimizes a total sum of costs applied between each said network operation units paired which are connected with each other.

22. The non-transitory computer-readable medium according to claim 17, wherein in said determination processing, said network operation unit to be used is determined every time a site is sequentially selected, a site to be newly selected is determined based on a Prim's algorithm and said network operation unit to be used in said site to be newly selected is determined based on a total number of connection relationships given in advance with said network operation unit of other site.

23. The non-transitory computer-readable medium according to claim 17, wherein said network operation unit comprises an autonomous system forming the Internet.

24. The non-transitory computer-readable medium according to claim 17, wherein said network operation unit comprises an Ethernet domain.

25. The network designing method according to claim 1, wherein the determining of the combination of said network operation units is based on an existence of a connection relationship for each pair of the candidates of said network operation units between different sites and a distance between each of the pair of the candidates of said network operation units between different sites.

26. The network designing method according to claim 1, wherein only one autonomous system is selected for each site that includes a plurality of the autonomous systems, among the plurality of sites, and wherein the selecting of the only one autonomous system among the plurality of autonomous systems is for selection of inter-site connection paths.

27. The network designing method according to claim 1, wherein said network operation unit to be used in said site to be newly selected is determined based on a total number of connection relationships forming a minimum spanning tree as an objective function to calculate an optimum network operation unit combination given in advance of said site being newly selected with said network operation unit of other site.

* * * * *